(12) United States Patent
Kwon et al.

(10) Patent No.: US 9,202,535 B2
(45) Date of Patent: Dec. 1, 2015

(54) LOW-POWER INTERFACE AND METHOD OF OPERATION

(71) Applicant: QUALCOMM Incorporated, San Diego, CA (US)

(72) Inventors: Chang Ki Kwon, San Diego, CA (US); Wilson Jianbo Chen, San Diego, CA (US); Reza Jalilizeinali, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 340 days.

(21) Appl. No.: 13/797,775

(22) Filed: Mar. 12, 2013

(65) Prior Publication Data

US 2014/0266382 A1  Sep. 18, 2014

(51) Int. Cl.
  *G11C 7/00* (2006.01)
  *G11C 7/10* (2006.01)

(52) U.S. Cl.
  CPC .................................. *G11C 7/1084* (2013.01)

(58) Field of Classification Search
  CPC ....................................................... G05F 1/59
  USPC .......................................................... 327/321
  See application file for complete search history.

(56) References Cited

U.S. PATENT DOCUMENTS

| | | | |
|---|---|---|---|
| 6,642,740 B2 * | 11/2003 | Kim et al. ........................ | 326/30 |
| 6,828,775 B2 | 12/2004 | Chow et al. | |
| 7,034,566 B2 * | 4/2006 | Cranford et al. ................ | 326/30 |
| 7,281,141 B2 | 10/2007 | Elkayam et al. | |
| 7,329,966 B2 | 2/2008 | Konishi | |
| 2007/0152752 A1 * | 7/2007 | Oishi ............................. | 330/252 |
| 2007/0205841 A1 * | 9/2007 | Imai ............................... | 331/176 |
| 2008/0061894 A1 * | 3/2008 | Raita et al. ...................... | 331/57 |
| 2008/0232161 A1 * | 9/2008 | Choi et al. ...................... | 365/163 |
| 2009/0122622 A1 | 5/2009 | Park et al. | |
| 2009/0302888 A1 * | 12/2009 | Shumarayev et al. .......... | 326/62 |
| 2011/0028089 A1 * | 2/2011 | Komori ........................... | 455/39 |
| 2011/0128153 A1 | 6/2011 | Sims et al. | |
| 2014/0294132 A1 * | 10/2014 | Yamaguchi .................... | 375/362 |

* cited by examiner

*Primary Examiner* — Ryan Jager
(74) *Attorney, Agent, or Firm* — Haynes and Boone, LLP (57) ABSTRACT

In a particular embodiment, a method includes modifying an output impedance associated with the input receiver. In response to modifying the output impedance, the method restricts an output voltage at an output node of the input receiver. Particular embodiments of an input receiver circuit are also disclosed.

13 Claims, 5 Drawing Sheets

LOW-POWER INTERFACE AND METHOD OF OPERATION

I. FIELD

The present disclosure is generally related to electronic devices and more particularly to electronic device interfaces.

II. DESCRIPTION OF RELATED ART

Advances in technology have resulted in smaller and more powerful electronic devices. For example, there currently exist a variety of mobile devices, such as wireless telephones, personal digital assistants (PDAs), and paging devices. The mobile devices may be small, lightweight, and easily carried by users. Wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, wireless telephones and other electronic devices can include significant computing capabilities.

Increasingly, users expect electronic devices to provide fast performance while also consuming low power (e.g., having long battery life). The electronic devices may store and process a large number of instructions to enable fast performance. Battery life may be conserved by reducing the number of the instructions or the speed at which the instructions are processed. For example, an interface used to access the instructions may utilize a reduced power supply to reduce power consumption of the interface. However, conserving battery life in this manner slows performance of the mobile devices.

III. SUMMARY

To enable fast performance, a processor may access instructions stored "off-chip" at a memory via a high-speed interface, such as a low-power double data rate (LPDDR) interface. Because the input signals may be of a high voltage that generally should not be applied directly to core circuitry (e.g., due to potential damage to the core circuitry), the input signals may be shifted from a first (e.g., input/output or "pad") voltage level to a second (e.g., "core") voltage level by the high-speed interface. The high-speed interface may include multiple input receivers to receive and level-shift the input signals. Because the input receivers are associated with high power consumption, it may be efficient to disconnect or "turn off" the input receivers when data is not being written to or read from the memory. In addition, the input receivers should activate or "wake up" quickly in response to the input signals (i.e., the input receivers should be associated with low latency), which may be difficult if the input receivers are turned off when the input signals are received. Accordingly, designing a power-efficient high-speed interface while achieving low latency poses design challenges, since it may be difficult to achieve both fast operation of the processor and low-power operation of the high-speed interface.

In at least one embodiment, the high-speed interface includes an input receiver that deactivates or "powers down" by disconnecting an output load of the input receiver when data is not being written to or read from the memory. The output load may be disconnected instead of disconnecting an input node (e.g., an analog input node or a bias source) of the input receiver. Because the input node may be tied to multiple input receivers of the high-speed interface, the input node may have a high capacitance and may take a relatively long time to "settle" in response to input signals. Such a high capacitance may also make the high-speed interface slow to turn off after detecting that the input signals are not being received at the high-speed interface. By disconnecting the output load instead of the bias source, the time for "wakeup" is reduced.

The high-speed interface may further include circuitry to restrict (e.g., clamp) an output voltage at an output node of the input receiver. As an example, because disconnecting the output load instead of the input node may potentially result in a spurious voltage at the output node, protection circuitry is used to limit the output voltage from exceeding a threshold (e.g., from reaching a voltage level that could damage core circuitry). In at least one embodiment, the protection circuitry restricts the voltage at the output node from exceeding or reaching a pad voltage level, which could damage core circuitry components.

In a particular embodiment, a device includes an input receiver. The input receiver includes a first output node, a first circuit, and a second circuit. The output node is configured to generate an output voltage. The first circuit is configured to modify an output impedance of the input receiver. The second circuit is configured to clamp the output voltage in response to the first circuit modifying the output impedance.

In another particular embodiment, a method of controlling power consumption associated with an input receiver includes modifying an output impedance associated with the input receiver. In response to modifying the output impedance, the method restricts an output voltage at an output node of the input receiver.

In another particular embodiment, an apparatus includes means for generating an output voltage. The apparatus further includes means for modifying an output impedance of an input receiver. The apparatus further includes means for clamping the output voltage when the output impedance of the input receiver is modified.

In another particular embodiment, a computer-readable storage medium stores data that is accessible to a processor via an interface during a first mode of operation of the interface. The interface includes an input receiver. The input receiver includes a first output node configured to generate an output voltage and a first circuit configured to modify an output impedance of the input receiver. The input receiver further includes a second circuit configured to clamp the output voltage in response to the first circuit modifying the output impedance.

One particular advantage provided by at least one of the disclosed embodiments is that an input receiver of a high-speed interface may be deactivated rapidly when input signals are not being applied to the input receiver. For example, by disconnecting an output load of the input receiver instead of disconnecting an input node of the input receiver, a "discharge" duration (e.g., a time duration during which a parasitic capacitive voltage at the input node is discharged) may be avoided. Further, by clamping or "equalizing" a voltage at the output node in response to disconnecting the output load, spurious signals at the output node can be reduced or avoided, thus protecting core circuitry that may otherwise be damaged by such spurious signals. In at least one embodiment, the input receiver is "woken up" while the output node is still charged by an "equalized" voltage, reducing or avoiding a latency caused by capacitive charging of the input node.

Other aspects, advantages, and features of the present disclosure will become apparent after review of the entire application, including the following sections: Brief Description of the Drawings, Detailed Description, and the Claims.

V. DETAILED DESCRIPTION

Figure 1:
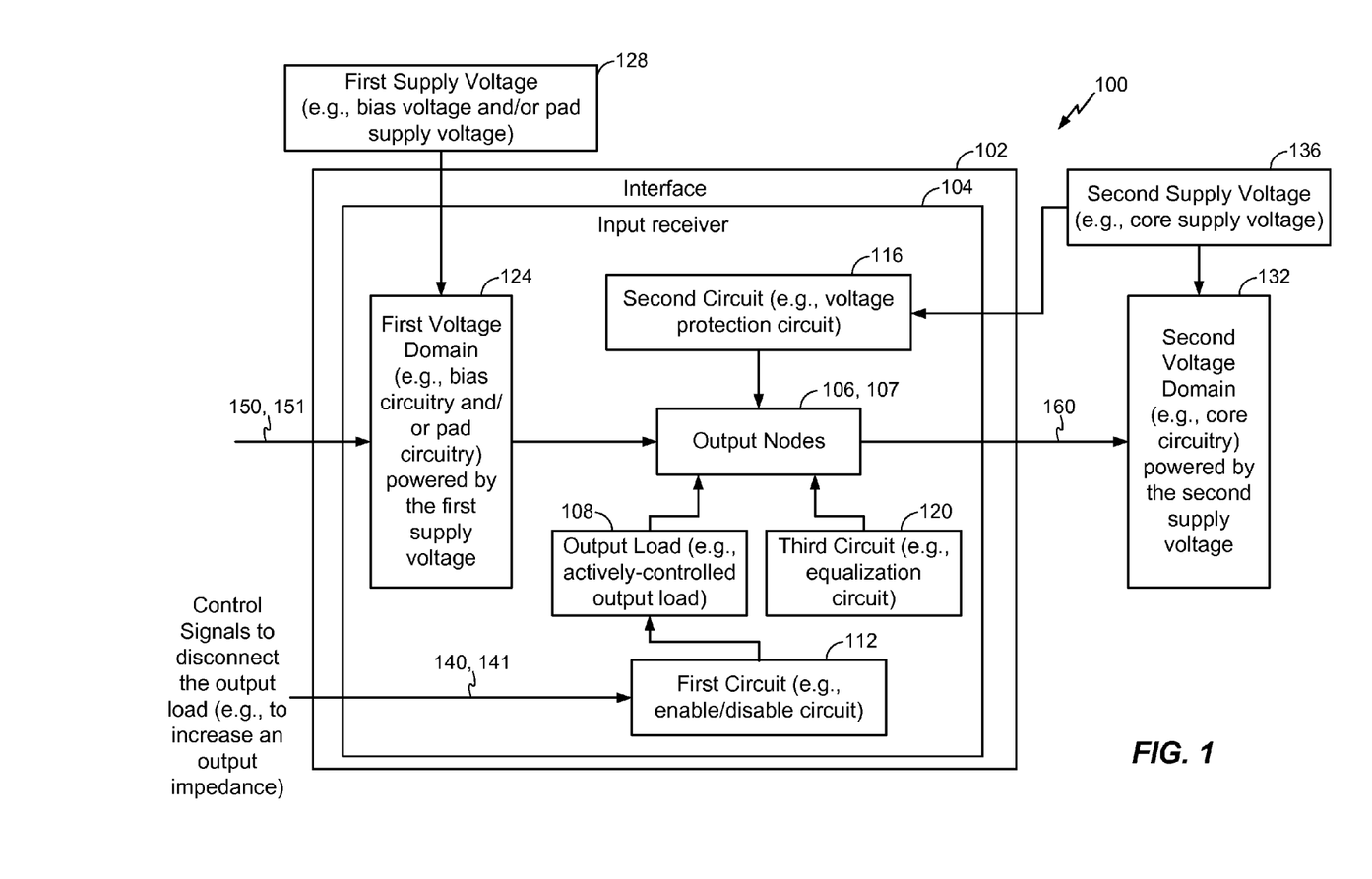
FIG. 1 is a block diagram of a particular illustrative embodiment of a device that includes an interface including an input receiver.

Referring to FIG. 1, a particular illustrative embodiment of a device is depicted and generally designated 100. The device 100 includes an interface 102. The interface 102 includes an input receiver 104. The input receiver 104 includes an output load 108, a first output node 106, and a second output node 107. The first output node 106 is configured to generate a first output voltage 160. In a particular embodiment, the output nodes 106, 107 correspond to a differential pair of output nodes configured to generate differential output voltages.

The device 100 further includes a first circuit 112 (e.g., an enable/disable circuit configured to enable/disable the output load 108), a second circuit 116 (e.g., a voltage protection circuit to restrict the first output voltage 160 from reaching or exceeding a threshold), and a third circuit 120 (e.g., an equalization circuit configured to equalize at least the first output voltage 160 when the output load 108 is disconnected). The output load 108 may be "actively-controlled" by the first circuit 112 in response to a first static control signal, which may correspond to a first control signal 140, and a second dynamic control signal, which may correspond to a second control signal 141.

The interface 102 may include a first voltage domain 124 powered by a first supply voltage 128. The interface 102 may be coupled to a second voltage domain 132 powered by a second supply voltage 136. The first supply voltage 128 may be associated with a first voltage level (e.g., a first magnitude), and the second supply voltage 136 may be associated with a second voltage level (e.g., a second magnitude). The first voltage level may be greater than the second voltage level. In a particular embodiment, the first voltage domain 124 and the first supply voltage 128 correspond to pad circuitry and a pad supply voltage, respectively.

The first voltage domain 124 may include bias circuitry configured to bias the input receiver 104. The second voltage domain 132 and the second supply voltage 136 may correspond to core circuitry and a core supply voltage, respectively. The interface 102 may further include additional input receivers (omitted from FIG. 1 for clarity). It should be appreciated that FIG. 1 is illustrative and that the structure of the device 100 may vary depending on the particular implementation, as described further with reference to FIG. 2 and FIG. 3.

In operation, the input receiver 104 may receive input signals 150, 151, such as from a device that is external to the interface 102. The input signals 150, 151 may correspond to data to be written at a memory of the second voltage domain 132. In a particular embodiment, the input signals 150, 151 correspond to a differential or pseudo-differential pair of input signals. The input receiver 104 may generate the first output voltage 160 in response to the input signals 150, 151 (e.g., to read data from or to write data to a memory included in the second voltage domain 132). To enter a "low-power" state (e.g., when the input signals 150, 151 are not being received), the first circuit 112 may modify an output impedance associated with the input receiver 104 by changing an internal resistance associated with the input receiver 104, as described further below.

Figure 2:
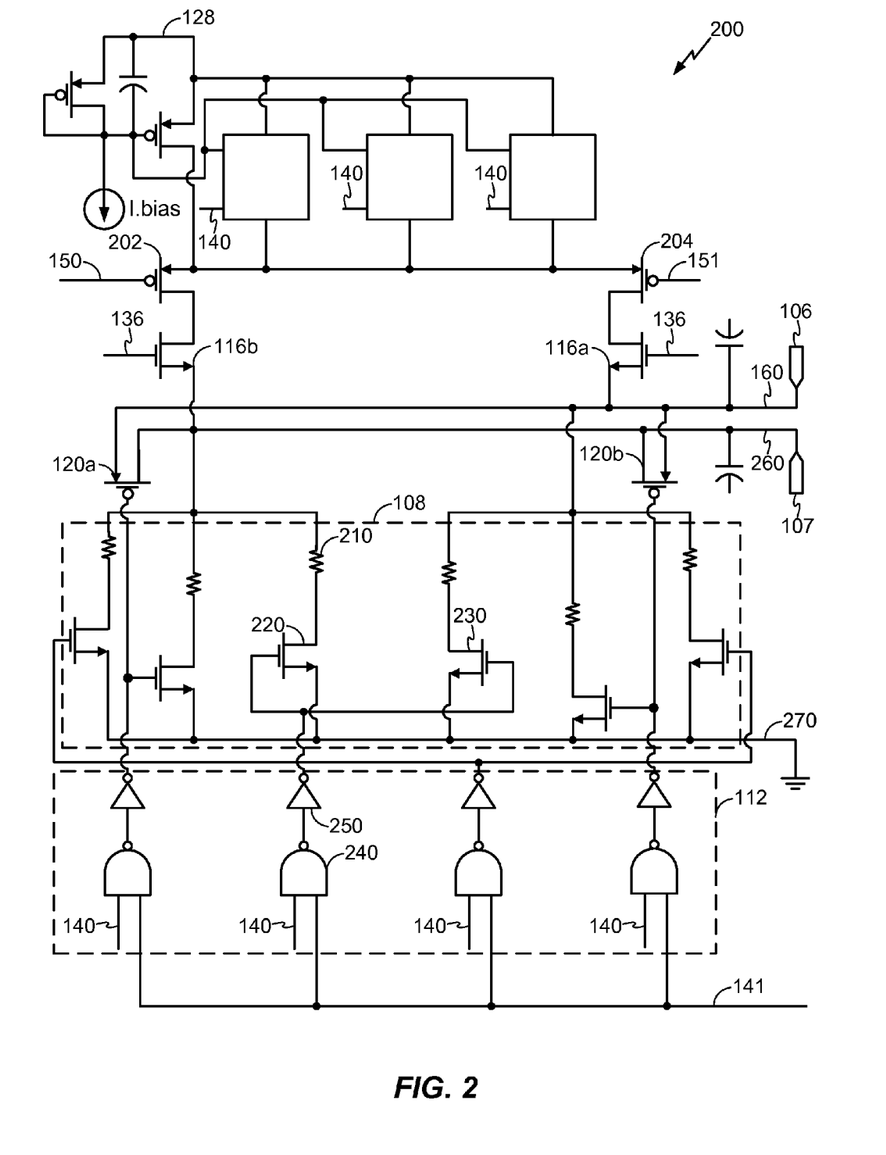
FIG. 2 is a diagram of a particular illustrative embodiment of the input receiver of FIG. 1.
Figure 3:
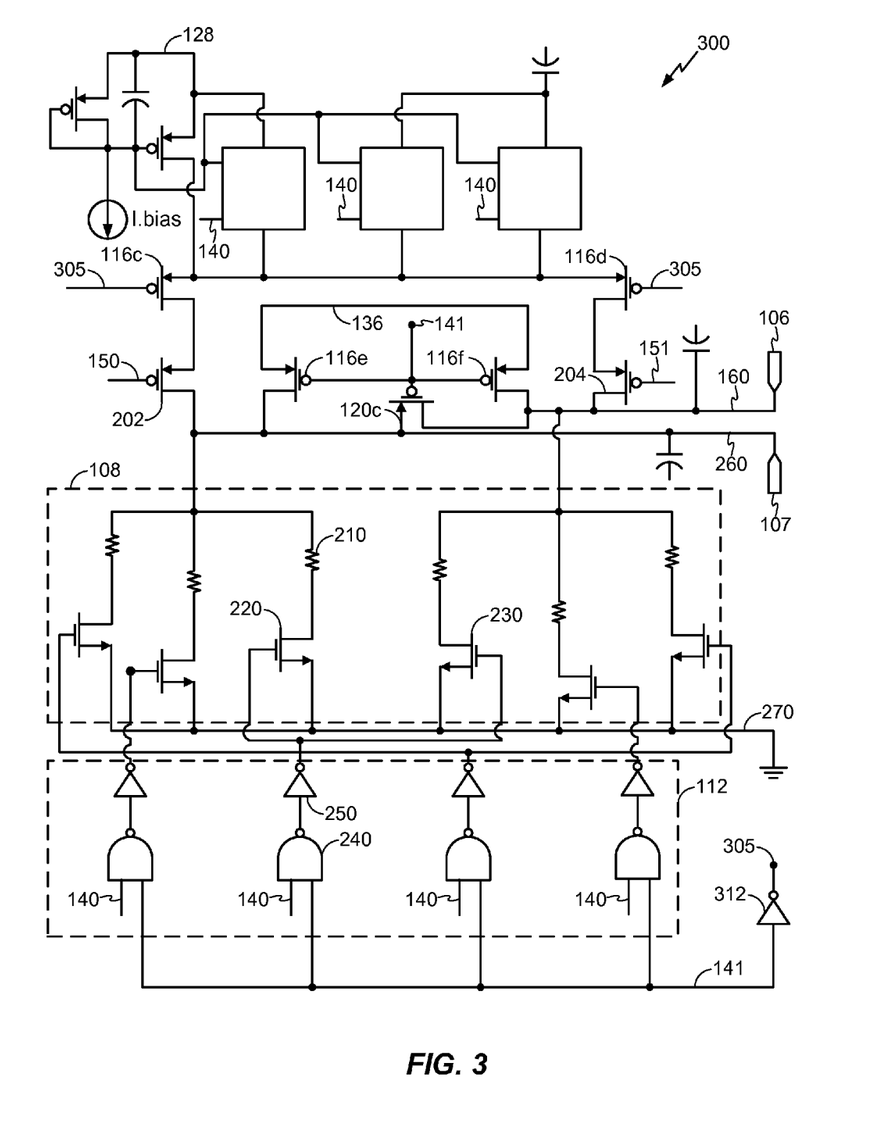
FIG. 3 is a diagram of another particular illustrative embodiment of the input receiver of FIG. 1.

In a particular embodiment, the first circuit 112 is responsive to the first control signal 140 and to the second control signal 141 (e.g., an input receiver enable/disable control signal, such as a digital code) to selectively disconnect the output load 108 (as described further with reference to FIGS. 2-3). The output load 108 may thus be "digitally" disconnected (e.g., based on one or more digital codes), as described further with reference to FIGS. 2-3.

In response to disabling the output load 108, the second circuit 116 may restrict the first output voltage 160. In a particular embodiment, the second circuit 116 includes a transistor configured to restrict (e.g., "clamp") the first output voltage 160 so that the first output voltage 160 does not exceed (or reach) the first voltage level of the first supply voltage 128. For example, the second circuit 116 may clamp the first output voltage 160 at a voltage determined by the second voltage level of the second supply voltage 136 minus a threshold voltage associated with the transistor. Accordingly, the second circuit 116 may limit the first output voltage 160 from exceeding (or reaching) the first voltage level of the first supply voltage 128 (since the second voltage level is typically less than the first voltage level), reducing the likelihood of components of the second voltage domain 132 (e.g., core circuitry) being damaged by an excessive voltage. Alternatively or in addition, and depending on the particular application, the second circuit 116 may restrict the first output voltage 160 from exceeding the second voltage level of the second supply voltage 136 (e.g., by connecting the first output node 106 to the second supply voltage 136) in response to disabling the output load 108.

Referring to FIG. 2, a particular illustrative embodiment of the input receiver 104 of FIG. 1 is depicted and generally designated 200. Certain components and operations of the input receiver 200 may be as described with reference to FIG. 1. For example, the input receiver 200 is responsive to the first supply voltage 128, to the second supply voltage 136, to the control signals 140, 141, and to the input signals 150, 151. The input receiver 200 further includes the output load 108 and the first circuit 112. The input receiver 200 further includes the output nodes 106, 107 (e.g., a differential pair of output nodes). The first output node 106 is configured to generate the first output voltage 160.

The input receiver 200 may include input nodes or input devices responsive to the input signals 150, 151. For example, FIG. 2 illustrates that a first input transistor 202 may be responsive to the first input signal 150 and a second input transistor 204 may be responsive to the second input signal 151. One or both of the input transistors 202, 204 may be p-type metal-oxide-semiconductor field-effect transistors (pMOSFETs).

In the particular example of FIG. 2, the input receiver 200 includes a first transistor 116a and a second transistor 116b. The transistors 116a, 116b may correspond to the second circuit 116 of FIG. 1. One or both of the transistors 116a, 116b may be n-type metal-oxide-semiconductor field-effect transistors (nMOSFETs). The input receiver 200 further includes a third transistor 120a and a fourth transistor 120b. The transistors 120a, 120b may correspond to the third circuit 120 of FIG. 1. One or both of the transistors 120a, 120b may be pMOSFETs.

FIG. 2 depicts that the output load 108 may include one or more resistors, such as a resistor 210, and may further include one or more transistors, such as a fifth transistor 220 and a sixth transistor 230. The first circuit 112 may include one or more logic gates, such as a not-AND (NAND) gate 240 coupled to a first inverter 250. The NAND gate 240 may be responsive to the control signals 140, 141, and the first inverter 250 may be coupled to the fifth transistor 220. In addition, the input receiver 200 is further configured to generate a second output voltage 260 at the second output node 107. The output voltages 160, 260 may correspond to a differential pair of output voltages.

The input receiver 200 may further include a ground node 270. The ground node 270 may be selectively coupled to the input transistors 202, 204 via the output load 108. For example, the ground node 270 may be selectively coupled to the input transistors 202, 204 when one or more transistors of the output load 108 (e.g., the transistors 220, 230) are activated by the first circuit 112. As another example, the ground node 270 may be selectively decoupled from the input transistors 202, 204 when one or more transistors of the output load 108 are deactivated by the first circuit 112.

Figure 5:
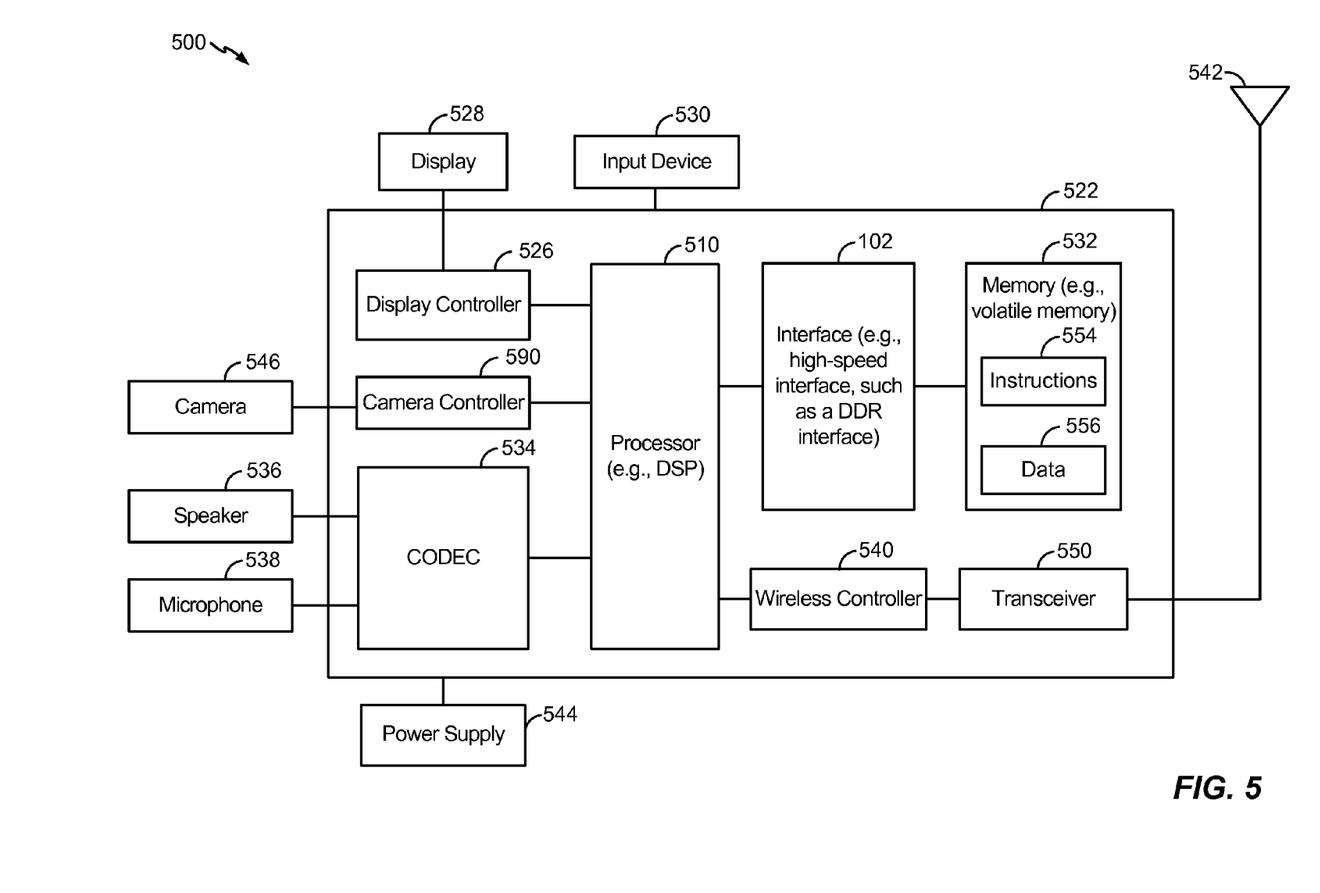
FIG. 5 is a block diagram of a particular illustrative embodiment of a mobile device that includes the interface of FIG. 1.

In operation, the input signals 150, 151 may be asserted to generate the output voltages 160, 260, respectively, to access data (e.g., data stored at a memory, as described further with reference to FIG. 5). For example, the data may be stored at a memory or other circuitry of the second voltage domain 132 of FIG. 1.

In response to the input signals 150, 151 not being asserted (e.g., upon initiation of a low-power mode of operation of the input receiver 200), the first circuit 112 may modify an output impedance of the input receiver 200 by disconnecting the output load 108. For example, when the input signals 150, 151 are not being asserted, one or both of the control signals 140, 141 may be transitioned from a logical high value (e.g., a logic one value) to a logical low value (e.g., a logic zero value). The NAND gate 240 is responsive to the control signals 140, 141 to generate a logical high output signal when one or both of the control signals 140, 141 have a logical low value. The first inverter 250 is responsive to the NAND gate 240 to generate a logical low output of the first circuit 112. The logical low output may deactivate (e.g., "gate off") the transistors 220, 230, disconnecting the input transistors 202, 204 from the ground node 270 (and thereby disconnecting the output load 108). By disconnecting the input transistors 202, 204 from the ground node 270, an output impedance of the input receiver 200 is modified (e.g., increased), since for example a "path to ground" from the input transistors 202, 204 to the ground node 270 (i.e., the output load 108) is disconnected from the input transistors 202, 204, thus increasing the output impedance.

In response to disconnecting the output load 108 from the ground node 270, the transistors 116a, 116b may clamp the output voltages 160, 260 at a clamped voltage level that is less than the first voltage level of the first supply voltage 128 and less than the second voltage level of the second supply voltage 136. For example, the first output voltage 160 may be clamped according to the second voltage level minus a first threshold voltage associated with the first transistor 116a by biasing the first output node 106 at the second voltage level minus the first threshold voltage. As another example, the second output voltage 260 may be clamped according to the second voltage level minus a second threshold voltage associated with the second transistor 116b by biasing the second output node 107 at the second voltage level minus the second threshold voltage. Alternatively, the output voltages 160, 260 may be clamped according to the second voltage level, as explained further with reference to FIG. 3.

In at least one embodiment, in response to disconnecting the output load 108 from the ground node 270 and/or in response to clamping the output voltages 160, 260, the transistors 120a, 120b "equalize" the first output voltage 160 with respect to the second output voltage 260. For example, the transistors 120a, 120b may be gated by logical low signals output by the first circuit 112, coupling the first output node 106 to the second output node 107 to "equalize" the output voltages 160, 260. By equalizing the output voltages 160, 260, a spurious output voltage at the output nodes 106, 107 caused by disabling the output load 108 may be reduced (e.g., "distributed" between the output nodes 106, 107). Further, the output nodes 106, 107 may remain "pre-charged" at the equalized voltage level. For example, when the input receiver 200 is "woken up" in response to assertion of the input signals 150, 151, the turn-on time (e.g., turn-on latency) of the input receiver 200 may be reduced, since the output nodes 106, 107 remain at least partially charged during the low-power (e.g., sleep) mode. The turn-on latency may be reduced as compared to a device in which one output node remains at a low voltage level and another output node remains at a high voltage level. As used herein, "equalize" does not necessarily denote a mathematical equivalence. Rather, those of skill in the art will recognize that partially or substantially transferring charge between the output nodes 106, 107 may reduce turn-on latency as described herein.

By operating the input receiver 200 as described with reference to FIG. 2, the interface 102 of FIG. 1 may be deactivated rapidly when the input signals 150, 151 are not being asserted at the input receiver 200. For example, by disconnecting the output load 108 from the ground node 270 instead of disconnecting an input node of the input receiver 200, a "discharge" latency (e.g., a time duration during which a parasitic capacitive voltage at the input transistors 202, 204 is discharged) may be reduced or avoided. Further, by clamping or "equalizing" the output voltages 160, 260 at the output nodes 106, 107 in response to disconnecting the output load 108 from the ground node 270, spurious signals at the output nodes 106, 107 can be reduced. Thus, the input receiver 200 may enable protection of circuitry (e.g., circuitry of the second voltage domain 132 of FIG. 1) that may otherwise be damaged by high voltage signals. Further, the input receiver 200 may be "woken up" while the output nodes 106, 107 remain at least partially charged according to the "equalized" voltage, reducing or avoiding a latency caused by capacitive charging of the input node.

As depicted in FIG. 2, the transistors 116a, 116b may be nMOSFETs. The input receiver 200 may be implemented in designs in which the output voltages 160, 260 are to be clamped to be less than the second voltage level of the second supply voltage 136 (e.g., at a level based on the second voltage level minus a transistor threshold voltage, as described with reference to FIG. 2). In at least one alternate embodiment, one or more pMOSFETs are used to clamp the output voltages 160, 260 according to the second voltage level of the second supply voltage 136, as described further with reference to FIG. 3.

Referring to FIG. 3, another particular illustrative embodiment of the input receiver 104 of FIG. 1 is depicted and generally designated 300. Certain components and operations of the input receiver 300 may be as described with reference to FIG. 1, as described with reference to FIG. 2, or a combination thereof. For example, the input receiver 300 is responsive to the first supply voltage 128, to the second supply voltage 136, to the control signals 140, 141, and to the input signals 150, 151. The input receiver 300 further includes the input transistors 202, 204, the output load 108, the first circuit 112, the output nodes 106, 107, the resistor 210, the transistors 220, 230, the NAND gate 240, the first inverter 250, and the ground node 270. The output nodes 106, 107 are configured to generate the output voltages 160, 260, respectively.

The input receiver 300 may further include a seventh transistor 116c, an eighth transistor 116d, a ninth transistor 116e, and a tenth transistor 116f. In a particular embodiment, the transistors 116c, 116d, 116e, 116f correspond to the second circuit 116 of FIG. 1. The transistors 116c, 116d may be configured to selectively couple and decouple the output nodes 106, 107 from the first supply voltage 128, and the transistors 116e, 116f may be configured to selectively couple and decouple the output nodes 106, 107 from the second supply voltage 136. The input receiver 300 may further include an eleventh transistor 120c, which may correspond to the third circuit 120 of FIG. 1.

In the particular example of FIG. 3, the input receiver 300 further includes a second inverter 312. The second inverter 312 inverts the second control signal 141 to generate a complement 305 of the second control signal 141, as illustrated. The transistors 116c, 116d may be responsive to (e.g., gated by) the complement 305, as shown in FIG. 3.

In operation, the first circuit 112 may modify an output impedance of the input receiver 300 (e.g., by disconnecting the output load 108 from the ground node 270) when the input signals 150, 151 are not being asserted, as described with reference to FIGS. 1 and 2. For example, one or both of the control signals 140, 141 may have a logical low value when the input signals 150, 151 are not being asserted, causing the first circuit 112 to modify the output impedance of the input receiver 300. Modifying the output impedance may include disconnecting the output load 108 from the ground node 270 by deactivating the transistors 220, 230 to decouple the input transistors 202, 204 from the ground node 270, as described with reference to FIG. 2.

In response to modifying the output impedance, the transistors 116c, 116d may be gated off by the complement 305. For example, when the second control signal 141 has a logical low value, the complement 305 has a logical high value. The logical high value of the complement 305 may deactivate (e.g., gate off) the transistors 116c, 116d, decoupling the output nodes 106, 107 from the first supply voltage 128. In addition, the transistors 116e, 116f may be activated by the logical low value of the second control signal 141, coupling the output nodes 106, 107 to the second supply voltage 136 (e.g., to "clamp" the output voltages 160, 260 according to the second voltage level of the second supply voltage 136). Accordingly, the output nodes 106, 107 may be decoupled from the first supply voltage 128 and coupled to the second supply voltage 136 in response to the input signals 150, 151 not being asserted at the input receiver 300 (e.g., during a low-power mode of operation).

Further, the eleventh transistor 120c may be responsive to the second control signal 141. For example, when the second control signal 141 has a logical low value, the eleventh transistor 120c may be activated to couple the first output node 106 to the second output node 107. Accordingly, the eleventh transistor 120c may "equalize" the first output voltage 160 with respect to the second output voltage 260 when the input signals 150, 151 are not asserted.

The input receiver 300 therefore describes at least one embodiment in which the output voltages 160, 260 are clamped based on the second voltage level of the second supply voltage 136. In a particular example, the input receiver 300 may be implemented in designs in which the output voltages 160, 260 are to be substantially equal to the second voltage level of the second supply voltage 136 during a low-power mode of operation. The input receiver 200 may be implemented in designs in which the output voltages 160, 260 are to be clamped to be less than the second voltage level of the second supply voltage 136 (e.g., at a level based on the second voltage level minus a transistor threshold voltage, as described with reference to FIG. 2).

Figure 4:
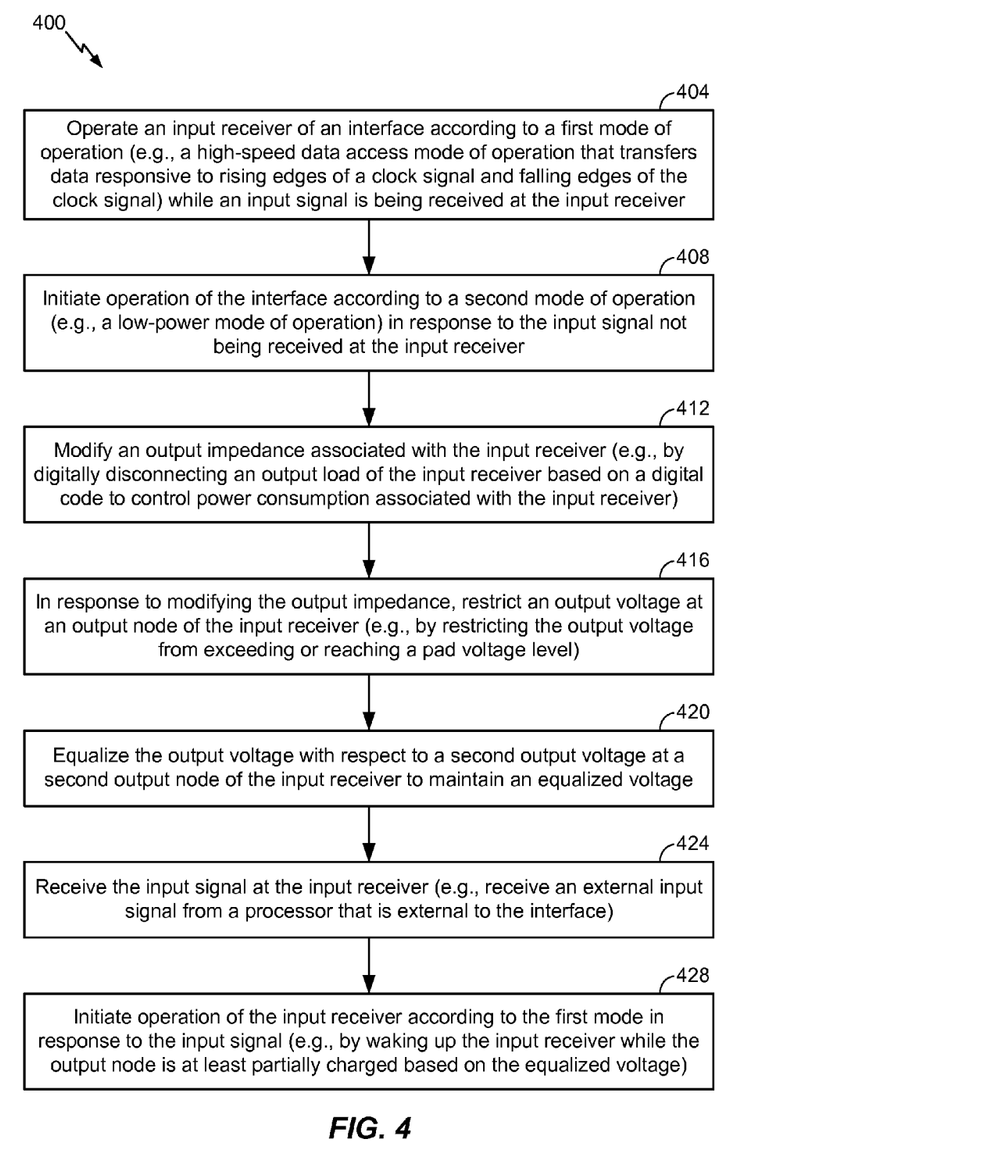
FIG. 4 is a flowchart that depicts a particular illustrative embodiment of a method of operating the interface of FIG. 1.

Referring to FIG. 4, a particular illustrative embodiment of a method of operating an input receiver of an interface is depicted and generally designated 400. The interface may correspond to the interface 102 described with reference to FIG. 1. The input receiver may correspond to the input receiver 104, the input receiver 200, the input receiver 300, or a combination thereof.

The method 400 includes operating the input receiver of the interface according to a first mode of operation while an input signal is being received at the input receiver, at 404. The input signal may correspond to the first input signal 150, the second input signal 151, or a combination thereof. The first mode of operation may correspond to a high-speed data access mode of operation.

At 408, operation of the interface according to a second mode of operation is initiated in response to the input signal not being received at the input receiver. The second mode of operation of the interface may correspond to a low-power mode of operation.

The method 400 further includes modifying an output impedance associated with the input receiver, at 412. For example, an output load of the input receiver may be disconnected based on a digital code to control power consumption associated with the input receiver. The output load may correspond to the output load 108 of any of FIGS. 1-3. The digital code may correspond to the first control signal 140, the second control signal 141, or a combination thereof.

In response to modifying the output impedance, an output voltage is restricted at an output node of the input receiver, at 416. The output voltage may correspond to the first output voltage 160, the second output voltage 260, or a combination thereof. The output node may correspond to the first output node 106, the second output node 107, or a combination thereof. In a particular illustrative embodiment, the output voltage is restricted from exceeding or reaching a pad voltage level, which may correspond to the first voltage level of the first supply voltage 128. In another embodiment, the output voltage is restricted from exceeding the pad voltage level by clamping the output voltage according to a core voltage level, which may correspond to the second voltage level of the second supply voltage 136.

At 420, the method 400 further includes equalizing the output voltage with respect to a second output voltage at a second output node of the input receiver to maintain an equalized voltage. The second output voltage may correspond to another of the output voltages 160, 260. The second output node may correspond to another of the output nodes 106, 107. In a particular illustrative embodiment, the output voltage is equalized using the third transistor 120a, the fourth transistor 120b, the eleventh transistor 120c, or a combination thereof.

At 424, the input signal is received at the input receiver. For example, as described further with reference to FIG. 5, an external input signal may be received from a processor. At 428, the method 400 further includes initiating operation of the input receiver according to the first mode of operation in response to the input signal. Initiating operation according to the first mode of operation in response to the input signal may include waking up the input receiver while the output node is at least partially charged based on the equalized voltage, as described with reference to FIGS. 1-3.

The method 400 of FIG. 4 is compatible with high-speed interfaces, such as double data rate (DDR) interfaces and low-power double data rate (LPDDR) interfaces. In particular, the method 400 may be utilized in high-speed interfaces that utilize a rising edge of a clock signal and a falling edge of the clock signal to read and write data to a memory. Accordingly, the method 400 may enable high-speed operation while reducing power consumption.

One or more operations described with reference to FIGS. 1-4, such as data access operations that utilize an interface, may be initiated by a field-programmable gate array (FPGA) device, an application-specific integrated circuit (ASIC), a processing unit such as a central processing unit (CPU), a digital signal processor (DSP), a controller, another hardware device, a firmware device, or a combination thereof. For example, certain operations described with reference to FIGS. 1-4 may be initiated by a processor that executes instructions stored at a memory, as described further with reference to FIG. 5.

Referring to FIG. 5, a block diagram of a particular illustrative embodiment of a mobile device is depicted and generally designated 500. The mobile device 500 may include a processor 510, such as a digital signal processor (DSP). The processor 510 may be coupled to a computer-readable storage medium, such as a memory 532 (e.g., a non-transitory computer-readable medium), via the interface 102. As depicted in FIG. 5, the processor 510 may be external to the interface 102. For example, the processor 510 may be "off-chip" with respect to the interface 102. In another embodiment, the processor 510 and the interface 102 are integrated within a system-in-package or system-on-chip device 522, as explained further below.

The memory 532 may store instructions 554 that are executable by the processor 510, data 556 that is accessible to the processor 510, or a combination thereof. In a particular embodiment, the memory 532 is a volatile memory that is accessible to the processor via the interface 102. The interface 102 may be a high-speed interface, such as a double data rate (DDR) interface. The interface 102 may read and write the data 556 responsive to a rising edge of a clock signal and a falling edge of the clock signal, as described with reference to FIG. 4.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534. FIG. 5 also indicates that a wireless controller 540 can be coupled to the processor 510. The wireless controller may be further coupled to an antenna 542 via a transceiver 550. A camera 546 may be coupled to a camera controller 590. The camera controller 590 may be coupled to the processor 510.

In a particular embodiment, the processor 510, the interface 102, the memory 532, the display controller 526, the camera controller 590, the CODEC 534, the wireless controller 540, and the transceiver 550 are included in the system-in-package or system-on-chip device 522. An input device 530 and a power supply 544 may be coupled to the system-on-chip device 522. The power supply 544 may correspond to the first supply voltage 128 or the second supply voltage 136.

Moreover, in a particular embodiment, and as illustrated in FIG. 5, the display 528, the input device 530, the camera 546, the speaker 536, the microphone 538, the antenna 542, and the power supply 544 are external to the system-on-chip device 522. However, each of the display 528, the input device 530, the camera 546, the speaker 536, the microphone 538, the antenna 542, and the power supply 544 can be coupled to a component of the system-on-chip device 522, such as to an interface or to a controller. As a particular example, the processor 510 and the memory 532 are coupled to the interface 102.

In connection with the described embodiments, a computer-readable storage medium (e.g., the memory 532) stores data (e.g., the data 556) that is accessible to a processor (e.g., the processor 510) via an interface (e.g., the interface 102) during a first mode of operation of the interface (e.g., during a high-speed data access mode of operation). The interface includes an input receiver (e.g., the input receiver 104, the input receiver 200, the input receiver 300, or a combination thereof). The input receiver includes a first output node (e.g., the first output node 106 or the second output node 107) configured to generate an output voltage (e.g., the first output voltage 160 or the second output voltage 260). The input receiver further includes a first circuit (e.g., the first circuit 112) configured to disconnect an output load (e.g., the output load 108) of the input receiver. The input receiver further includes a second circuit configured to restrict the output voltage from exceeding a first voltage level of a first supply voltage in response to the first circuit disconnecting the output load. The second circuit may correspond to the second circuit 116, the transistors 116a, 116b, 116c, 116d, 116e, 116f, or a combination thereof. The first supply voltage may correspond to the first supply voltage 128.

In conjunction with the described embodiments, an apparatus includes means for generating (e.g., the first output node 106, the second output node 107, or a combination thereof) an output voltage (e.g., the first output voltage 160, the second output voltage 260, or a combination thereof). The apparatus further includes means for modifying (e.g., the first circuit 112) an output impedance of an input receiver (e.g., the input receiver 104, the input receiver 200, the input receiver 300, or a combination thereof). The apparatus further includes means for clamping (e.g., the second circuit 116, the transistors 116a, 116b, 116c, 116d, 116e, 116f, or a combination thereof) the output voltage, such as by restricting the output voltage from exceeding a second voltage level of a second supply voltage (e.g., the second supply voltage 136) when the output impedance of the input receiver is modified.

Those of skill in the art will appreciate that the foregoing disclosed devices and functionalities may be designed and configured into computer files (e.g. RTL, GDSII, GERBER, etc.) stored on computer-readable media. Some or all such files may be provided to fabrication handlers who fabricate devices based on such files. Resulting products include semiconductor wafers that are separated into semiconductor dies and packaged into semiconductor chips. The semiconductor chips are then employed in devices, such as the device 100, the mobile device 500, or a combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A device comprising:
an input receiver having a first mode of operation in which the input receiver is configured to receive an input voltage signal from a first power domain powered by a first supply voltage and to level-shift the input voltage signal into an output voltage signal carried on a first output node in a second power domain powered by a second supply voltage that is less than the first voltage, the input receiver having a second mode of operation in which the input receiver does not receive the input voltage signal, the input receiver comprising:
an output load coupled to the first output node;
a first circuit configured to disconnect the output load from ground to prevent the output load from loading the first output node during the second mode of operation and to connect the output load to ground to load the first output node with the output load during the first mode of operation; and
a second circuit configured to clamp the output voltage signal during the second mode of operation.

2. The device of claim 1, wherein the input receiver further comprises:
a second output node in the second power domain, and wherein the output voltage signal is a differential voltage signal comprising a first output voltage signal carried on the first output voltage node and a second output voltage carried on the second output node; and
a third circuit configured to equalize the first output voltage signal with respect to the second output voltage signal during the second mode of operation.

3. The device of claim 2, wherein the third circuit includes at least one p-type metal-oxide-semiconductor field-effect transistor (pMOSFET).

4. The device of claim 1, wherein the first circuit includes a plurality of logic gates responsive to a digital code to disconnect the output load from ground during the second mode of operation and to connect the output load to ground during the first mode of operation.

5. The device of claim 4, wherein the plurality of logic gates includes a not-AND (NAND) gate and an inverter.

6. The device of claim 1, wherein the second circuit includes a clamp transistor configured to clamp the output voltage signal at the second supply voltage minus a threshold voltage for the clamp transistor.

7. The device of claim 6, wherein the first supply voltage is a pad supply voltage, and wherein the second supply voltage is a core supply voltage.

8. The device of claim 7, wherein the clamp transistor is an n-type metal-oxide-semiconductor field-effect transistor (nMOSFET).

9. The device of claim 1, wherein the input receiver is part of an interface device.

10. The device of claim 1, further comprising:
a processor coupled to at least one input transistor of the input receiver; and
a memory coupled to the first output node of the input receiver.

11. A method of controlling power consumption associated with an input receiver, the method comprising:
during a first mode of operation for the input receiver, receiving an input voltage signal from a first power domain powered by a first supply voltage and level-shifting the input voltage signal into an output voltage signal carried on a first output node in a second power domain powered by a second supply voltage that is less than the first voltage;
modifying an output impedance associated with the input receiver during the first mode of operation by connecting to ground an output load coupled to the first output node;
during a second mode of operation for the input receiver in which the input receiver does not receive the input voltage signal, modifying the output impedance by disconnecting the output load from ground; and
clamping the output voltage signal during the second mode of operation.

12. The method of claim 11, wherein the output voltage signal is a differential voltage signal comprising a first output voltage signal carried on the first output voltage node and a second output voltage signal carried on a second output node in the second power domain, the method further comprising equalizing the first output voltage to the second output voltage signal during the second mode of operation.

13. The method of claim 11, wherein disconnecting the output load is responsive to a digital code.

* * * * *